United States Patent [19]

Eastland et al.

[11] 4,000,472
[45] Dec. 28, 1976

[54] AMPLITUDE MODULATION ENVELOPE DETECTOR WITH TEMPERATURE COMPENSATION

[75] Inventors: Franklin M. Eastland, Linthicum Heights; Camille S. Marie, Pikesville; Christopher B. Schwerdt, Catonsville, all of Md.

[73] Assignee: Westinghouse Electric Corporation, Pittsburgh, Pa.

[22] Filed: Dec. 30, 1975

[21] Appl. No.: 645,498

[52] U.S. Cl. .............................. 329/204; 329/109
[51] Int. Cl.$^2$ ......................................... H03D 1/10
[58] Field of Search .......... 329/204, 101, 109, 135

[56] References Cited
UNITED STATES PATENTS

| | | | |
|---|---|---|---|
| 3,002,154 | 9/1961 | Schmitz et al. | 329/101 |
| 3,003,122 | 10/1961 | Gerhard | 329/101 |
| 3,348,158 | 10/1967 | Dennis | 329/204 |
| 3,386,042 | 5/1968 | Moes | 329/204 |

*Primary Examiner*—John Kominski
*Attorney, Agent, or Firm*—D. Schron

[57] ABSTRACT

An amplitude modulation envelope detector comprised of a basic voltage doubler envelope detector whose linear dynamic range is increased by a forward bias network and for which the offset voltage is stabilized by temperature drift compensation provided by a temperature compensation network. The forward bias network increases the basic envelope detector linear dynamic range by clamping the basic detector to a predetermined bias voltage which takes the detector components out of the non-linear region of operation, and the temperature compensation network, which is comprised of components matched to those found in the basic envelope detector, stabilizes the offset voltage by providing a signal to the inverting input of an operational amplifier to compensate for the operating characteristic variations of the components in the basic envelope detector and the forward bias network.

12 Claims, 1 Drawing Figure

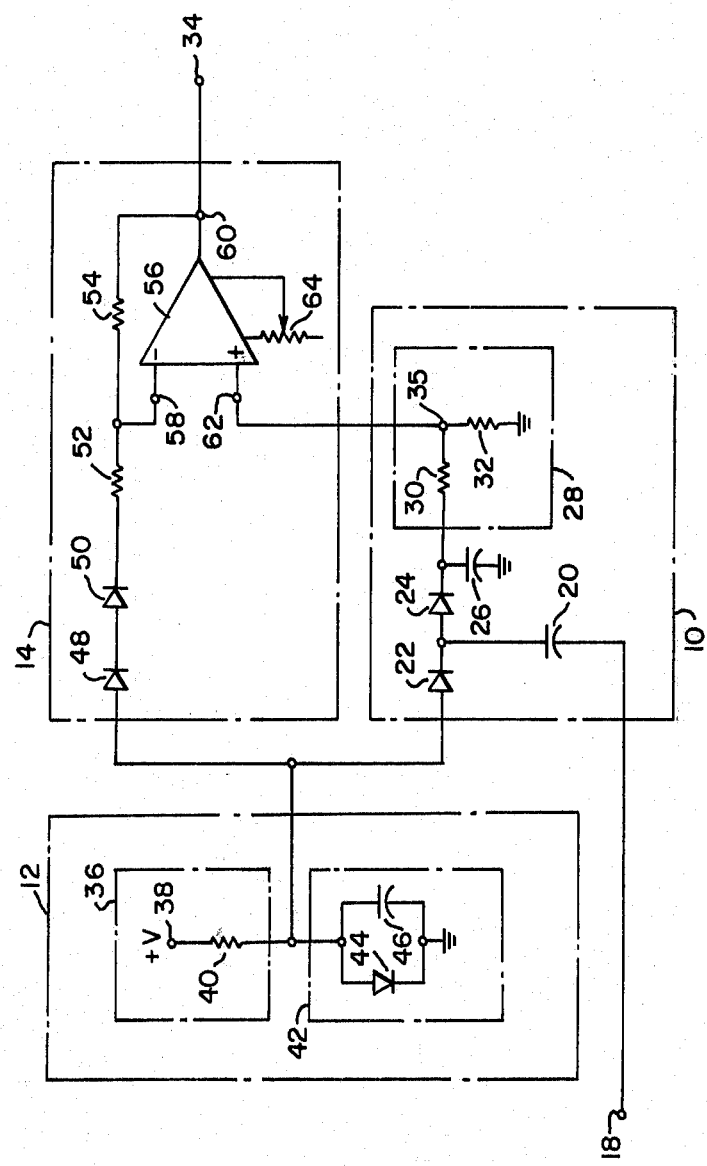

AMPLITUDE MODULATION ENVELOPE DETECTOR WITH TEMPERATURE COMPENSATION

BACKGROUND OF THE INVENTION

1. Field of the Invention

The invention relates to amplitude modulation envelope detectors having a wide operating range and which are provided with temperature drift compensation.

2. Description of the Prior Art

Amplitude modulation envelope detectors have been employed in radar and other systems to obtain video bandwidth information frequencies as a linear function of the modulated carrier signal. Since, in these systems, the modulation bandwidth may be on the order of Mega-Hertz or considerably greater, in order to obtain the modulation frequencies at the output of the detector in a linear manner, the impedance acting as a load is generally maintained small to provide a wide video bandwidth. However, for small load impedances, low amplitude input signals to the detector become affected by the non-linear region of the operating characteristics of the detector components. Increasing the envelope detector drive level to remain above the component non-linear operating region had the disadvantage of requiring high drive power requirements for the detector. Therefore, forward biasing of the detector components has been employed to improve the linearity of component operating characteristics at low input levels. However, the temperature drift component characteristics of these forward biased detectors resulted in an unstable offset voltage causing the loss of low level input signals. Without temperature compensation, a stable offset voltage could not be maintained over a range of ambient temperatures.

The invention herein described was made in the course of or under a contract or subcontract thereunder with the Department of the Air Force.

SUMMARY OF THE INVENTION

An amplitude modulation envelope detector which detects information signals appearing as the amplitude modulation of a carrier signal, is comprised of a basic voltage doubler envelope detector which provides an output voltage in linear relation to the envelope of the carrier signals. A voltage bias network improves the voltage doubler detector linear operating range by providing a predetermined bias voltage to the voltage doubler envelope detector, and a temperature compensation network obviates the offset voltage instability of the voltage doubler envelope detector by compensating for component operational characteristic variations caused by fluctuations in the ambient temperature. The basic voltage doubler envelope detector includes an input terminal, and a blocking-charging capacitor which filters the direct current component from signals provided to the input terminal and provides a charging voltage in cooperation with a clamping diode.

The input signal, as filtered by the blocking-charging capacitor, is applied to the cathode of the clamping diode and to the anode of a forward conducting diode. The predetermined voltage of the forward bias network is applied to the anode of the clamping diode so that the minimum excursions of the carrier signals are clamped to the predetermined voltage. The forward conducting diode provides the filtered output of the amplifier to a first filter capacitor, which removes the carrier frequency, and to a voltage divider comprised of first and second impedances. The voltage across the second impedance provides a voltage signal indicative of the envelope of the carrier signals.

The forward bias network includes a constant current source which provides a predetermined voltage across a low impedance path. The constant current source is comprised of a voltage source and a bias current resistance, and the low impedance path is comprised of a bias current diode and a second filter capacitor.

The temperature compensation network includes a first compensating diode having operational characteristics which are matched to the operational characteristics of the clamping diode of the voltage doubler envelope detector, and a second compensating diode whose operational characteristics are matched to those characteristics of the forward conduction diode also contained in the voltage doubler envelope detector. Also contained in the compensation network are a first compensating impedance whose operational characteristics are matched to the characteristics of a first impedance in the voltage divider of the envelope detector and a second compensating impedance whose operational characteristics are matched to the second impedance in the envelope detector's voltage divider. The first and second compensating diodes and the first compensating impedance are connected in series relation between the bias voltage of the forward bias network and the inverting input of an operational amplifier while the second compensating impedance is included in the feedback loop of the operational amplifier. The signal across the second impedance of the voltage doubler envelope detector is provided to the non-inverting input of the operational amplifier so that the temperature compensation network eliminates offset voltage fluctuations in the voltage doubler envelope detector by compensating for variations in the operational characteristics of the basic detector and forward biasing network components over a wide temperature range.

BRIEF DESCRIPTION OF THE DRAWINGS

The drawing shows a symbolic representation of a circuit comprising the preferred embodiment of the disclosed amplitude modulation envelope detector.

PREFERRED EMBODIMENT OF THE INVENTION

As shown in the figure, the preferred embodiment of the disclosed amplitude modulated envelope detector is comprised of a basic voltage doubler envelope detector 10 which is provided with a bias voltage from forward bias network 12, and temperature drift compensation by temperature compensation network 14.

Voltage doubler envelope detector 10 is provided with an input terminal 18, and a blocking-charging capacitor 20 for filtering out the direct current component of the signal provided for terminal 18 and for providing a charging voltage in cooperation with clamping diode 22. The alternating current component of the input signal is clamped through clamping diode 22 to a predetermined forward bias voltage provided by forward bias network 12 which will be described later. The signal provided to input terminal 18, as filtered by blocking-charging capacitor 20, is transferred for envelope detection through forward conducting diode 24 to a first filter capacitor 26 and voltage divider 28 which are connected in parallel relation between the cathode of forward conducting diode 24 and ground potential. Voltage divider 28 is comprised of a first impedance which, for example, may be comprised of a first resistance 30 and a second impedance which, for example, may be comprised of a second resistance 32 which is in series connection with the first impedance.

Output terminal 34 is connected, through temperature compensation network 14, to the junction 35 between the first resistance 30 and the second resistance 32. The direct current component of a signal applied to input terminal 18 will be filtered out by blocking-charging capacitor 20. The minimum excursion of the alternating current component of the output of blocking-charging capacitor 20 is clamped to the bias voltage of forward bias network 12 by clamping diode 22 so that the output signal appearing at junction 35 is approximately twice the amplitude as the envelope of the signal provided to input terminal 18. The alternating current output of blocking-charging capacitor 20 flows through forward conducting diode 24 to the parallel combination of first filter capacitor 26 and voltage divider 28. The impedance of the parallel combination of filter capacitor 26 and voltage divider 28 is such that filter capacitor 26 affords a low impedance path to signals of the carrier frequency but a high impedance path to signals of the information frequency which is the amplitude modulation of the carrier frequency. Signals of the information frequency flow through voltage divider 28 to ground potential thereby providing a voltage output at junction 35 in relation to the resistive magnitude of second resistance 32.

Forward bias network 12, which provides the bias voltage to voltage doubler envelope detector 10, includes constant current source 36, which is comprised of voltage source 38 and bias current resistance 40, and low impedance path 42, which is comprised of bias current diode 44 and second filter capacitor 46. Voltage source 38 maintains a constant voltage across bias current resistance 40 so that constant current source 36 provides a bias current whose direction depends on the polarity of the voltage source 38 and whose magnitude is dependent on the voltage magnitude of voltage source 38 and the impedance magnitude of bias current resistance 40. Bias current diode 44 and second filter capacitor 46 are connected in electrically parallel paths between bias current resistance 40 and ground potential. The impedance of second filter capacitor 46 is such that capacitor 46 affords, for signals in the range of the carrier frequency, a low impedance path from the anode of clamping diode 22 to ground potential thereby filtering out signals in the carrier frequency range. Bias current diode 44 provides a conduction path for the bias current of constant current source 36 to ground potential. The constant forward voltage drop across bias current diode 44 also appears across the parallel connected second filter capacitor 46 and provides the bias voltage to voltage doubler envelope detector 10. The bias voltage provided by forward bias network 12 raises the operational voltage level of clamping diode 22 and forward conducting diode 24 out of their square law regions to improve the linear input/output characteristic range of voltage doubler envelope detector 10. The voltage appearing across second resistance 32 as a result of the bias voltage which is the forward voltage drop across bias current diode 44 is known as the offset voltage. Since diode characteristics vary with temperature, the linearity of the input/output characteristic of the voltage doubler envelope detector 10, and the offset voltage due to the current flowing through clamping diode 22 and forward conducting diode 24 as a result of the forward voltage drop of bias current diode 44 will vary over a range of ambient temperature.

The non-linearity in the input/output characteristic and the instability in offset voltage resulting from operational characteristic variations of the clamping diode 22, the forward conducting diode 24 and bias current diode 44 are obviated by temperature compensation network 14. Temperature compensation network 14 is comprised of a first compensating diode 48, a second compensating diode 50, a first compensating impedance 52, a second compensating impedance 54 and an operational amplifier 56. First and second compensating diodes 48 and 50 and first compensating impedance 52 are connected in series relation between the output of forward bias network 12 and the inverting input 58 of operational amplifier 56. Second compensating impedance 54 is contained in a feedback loop between the output terminal 60 and the inverting input terminal 58 of operational amplifier 56. The non-inverting input terminal 62 of operational amplifier 56 is connected to the junction between first and second resistances 30 and 32 of voltage doubler envelope detector 10.

Temperature compensating network 14 compensates for the temperature drift of clamping diode 22, forward conducting diode 24, and bias current diode 44 by cancelling in operational amplifier 56, variations caused by ambient temperature changes. First and second compensating diodes 48 and 50 and first and second compensating impedances 52 and 54 are selected such that the operational characteristics of first and second compensating diodes 48 and 50 are substantially matched to the operational characteristics of clamping diode 22 and forward conducting diode 24 respectively, and the operational characteristics of first and second compensating impedances 52 and 54 are substantially matched to the operational characteristics of first and second resistances 30 and 32 respectively. Therefore, the current through first and second compensating diodes 48 and 50 is substantially equal to the current through clamping diode 22 and forward conducting diode 24 which results from the bias voltage across bias current diode 44.

For signals applied to inverting input 58, operational amplifier 56 provides a gain which is equal in magnitude but opposite in polarity to equivalent signals provided to the non-inverting input 62. Since the bias voltage of forward bias network 12 is applied to inverting input 58 and non-inverting input 62 through substantially identical current paths, and since the gain of operational amplifier 56 is equal in magnitude and opposite in polarity for signals provided to inverting input 58 and non-inverting input 62, the changes in component operating characteristics occurring as a result of a change in ambient temperature will be cancelled out in operational amplifier 56. The offset adjustment 64 of operational amplifier 56 may be adjusted for best linearity conditions independently of the ambient temperature. Output terminal 60 of operational amplifier 56 is connected to output terminal 34 to provide voltage doubler envelope detector 10 with ambient temperature compensation from temperature compensation network 14.

As a modification of the preferred embodiment, resistor 30 and compensating impedance 52 may be omitted from the circuit of the Figure at the cost of some degradation in the linearity of the envelope detector. Also, a further modification would provide for the junction of compensating impedances 52 and 54 to be connected to the non-inverting input 62 of operational amplifier 56 and the junction of resistors 30 and 32 to be connected to the inverting input, again causing some degradation in the linearity of the envelope detector.

We claim:

1. Apparatus for the detection of information signals which appear as the amplitude modulation of a carrier signal, said apparatus including:
   a voltage doubler envelope detector providing an output voltage in response to the amplitude modulation of said carrier signal;
   a forward bias network providing a bias voltage to said voltage doubler envelope detector to improve the linearity characteristics of said envelope detector; and
   a temperature compensation network which compensates for temperature drift of said envelope detector.

2. Apparatus for the detection of information signals which appear as the amplitude modulation of a carrier signal, said apparatus including:
   a voltage doubler envelope detector providing an output voltage in response to the amplitude modulation of said carrier signal;
   a forward bias network which is operative with said voltage doubler envelope detector for clamping said carrier signal provided to said envelope detector to a predetermined bias voltage such that said output voltage of said envelope detector includes an offset voltage; and
   a temperature compensation network which is operative with said envelope detector and with said forward bias network to stabilize said offset voltage of said envelope detector by compensating for the temperature drift of said envelope detector.

3. Apparatus for the detection of an information signal comprising the amplitude modulation of carrier signals, said apparatus including:
   a voltage doubler envelope detector providing an output voltage in response to the envelope of said carrier signals;
   a forward bias network which provides a predetermined bias voltage and which is operative with said voltage doubler envelope detector to improve the linearity in the voltage characteristics of said voltage doubler envelope detector by providing an offset component in said output voltage; and
   a temperature compensation network which is operative with said voltage doubler envelope detector and with said forward bias network to provide a temperature dependent, current path in relation to said bias voltage of said forward bias network to stabilize said offset voltage by compensating for changes in envelope detector operating characteristics due to changes in ambient temperature.

4. An amplitude modulation envelope detector for the detection of an information signal comprising the amplitude modulation of a carrier signal, said envelope detector comprising:
   a blocking-charging capacitor for providing an output voltage in response to said carrier signal;
   a bias current source which provides a predetermined bias current;
   a bias current path which provides a predetermined bias voltage in response to said bias current of said bias current source;
   a clamping diode for clamping the minimum excursions of the output voltage of said blocking-charging capacitor to said bias voltage of said bias current path;
   a forward conduction diode for the conduction of a signal in response to said output voltage provided by said blocking-charging capacitor;
   a filtering capacitor which is responsive to said forward conduction diode and a low impedance path to signals whose frequency is substantially similar to the frequency of said carrier signals, and which provides a high impedance path to signals whose frequency is substantially similar to the frequency of said information signals;
   a voltage divider which is responsive to said forward conduction diode and which provides an output voltage in response to signals whose frequency is substantially similar to the frequency of said carrier signals;
   a first compensating diode having operational characteristics substantially similar to the operational characteristics of said clamping diode; and
   a second compensating diode coupled in series relation to said first compensating diode and having operational characteristics substantially similar to the operational characteristics of said forward conducting diode.

5. The apparatus of claim 4 including:
   an operational amplifier providing a first gain of a predetermined polarity and magnitude in response to said first and second compensating diodes, and providing a second gain of a predetermined polarity and magnitude in response to said forward conducting diode where the magnitude of said first gain is substantially equal to the magnitude of said second gain.

6. The apparatus of claim 4 including:
   an operational amplifier providing a predetermined non-inverting gain in response to said first and second compensating diodes, and providing a predetermined inverting gain in response to said forward conducting diode of said envelope detector where the magnitude of said inverting gain is substantially equal to the magnitude of said non-inverting gain.

7. The apparatus of claim 5 including:
   at least one compensating impedance having operational characteristics substantially similar to the operational characteristics of said voltage divider, where said second compensating impedance is contained in a feedback loop of said operational amplifier.

8. An amplitude modulation envelope detector for the detection of an information signal comprising the amplitude modulation of a carrier signal, said envelope detector comprising:
   a blocking-charging capacitor for providing an output voltage in response to said carrier signal;
   a constant potential source;
   a bias resistor which is operative with said constant potential source to provide a bias current of a predetermined magnitude and direction;
   a bias current diode whose anode is coupled to said bias resistor and whose cathode is coupled to ground potential such that the forward voltage drop across said bias current diode provides a bias voltage;

a clamping diode for clamping the minimum excursions of the output voltage of said blocking-charging capacitor to said bias voltage of said bias current diode;

a first impedance coupled to said forward conduction diode in parallel relation to said filtering capacitor;

a forward conduction diode for the conduction of a signal in response to said output voltage provided by said blocking-charging capacitor;

a filtering capacitor which is responsive to said forward conduction diode and which provides a low impedance path to signals whose frequency is substantially similar to the frequency of said carrier signals, and which provides a high impedance path to signals whose frequency is substantially similar to the frequency of said information signal;

a first impedance coupled to said forward conduction diode in parallel relation to said filtering capacitor;

a second impedance coupled to said first impedance and to ground potential and which provides an output voltage in response to signals whose frequency is subtantially similar to the frequency of said carrier signals;

a first compensating diode having operational characteristics substantially similar to the operational characteristics of said clamping diode;

a second compensating diode coupled in series relation to said first compensating diode and having operational characteristics substantially similar to the operational characteristics of said forward conducting diode;

a first compensating impedance having operational characteristics substantially similar to the operational characteristics of said first impedance; and a second compensating impedance coupled in series relation with said first compensating impedance and having operational characteristics substantially similar to the operational characteristics of said second impedance.

9. The apparatus of claim 8 including:

an operational amplifier providing a first gain of a predetermined polarity and magnitude in response to said first and second compensating diodes, and providing a second gain of a predetermined polarity and magnitude in response to said forward conducting diode where the magnitude of said first gain is substantially equal to the magnitude of said second gain.

10. The apparatus of claim 8 including:

an operational amplifier providing a predetermined, non-inverting gain in response to said first and second compensating diodes, and providing a predetermined inverting gain in response to said forward conducting diode of said envelope detector where the magnitude of said inverting gain is substantially equal to the magnitude of said non-inverting gain.

11. The apparatus of claim 9 in which said second compensating impedance is contained in a feedback loop of said operational amplifier and which is coupled in series relation with said first compensating impedance.

12. The apparatus of claim 10 in which said second compensating impedance is contained in a feedback loop of said operational amplifier and which is coupled in series relation with said first compensating impedance.

* * * * *